United States Patent
Nagar

(10) Patent No.: US 9,320,183 B1
(45) Date of Patent: Apr. 19, 2016

(54) GROUND LID OPENING ON A SUBSTRATE

(71) Applicant: Cisco Technology, Inc., San Jose, CA (US)

(72) Inventor: Mohan R. Nagar, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 300 days.

(21) Appl. No.: 14/052,708

(22) Filed: Oct. 12, 2013

(51) Int. Cl.
| | |
|---|---|
| H05K 9/00 | (2006.01) |
| H01J 5/00 | (2006.01) |
| H01J 15/00 | (2006.01) |
| H05K 5/06 | (2006.01) |
| H01L 27/148 | (2006.01) |
| H01L 23/552 | (2006.01) |
| B21D 39/00 | (2006.01) |
| G06F 1/18 | (2006.01) |
| H01R 13/648 | (2006.01) |
| H05K 3/30 | (2006.01) |
| G03B 15/03 | (2006.01) |
| H01R 13/516 | (2006.01) |

(52) U.S. Cl.
CPC .............. *H05K 9/0007* (2013.01); *G06F 1/181* (2013.01); *G06F 1/182* (2013.01); *H01R 13/648* (2013.01); *H05K 9/00* (2013.01); *H05K 9/0009* (2013.01); *G03B 15/03* (2013.01); *H01R 13/516* (2013.01); *H05K 3/30* (2013.01)

(58) Field of Classification Search
CPC .... G03B 15/03; H01R 13/516; H01R 13/648; H05K 9/00; H05K 3/30; H05K 9/0007; H05K 9/0009; G06F 1/181; G06F 1/182
USPC ............ 361/816–818; 396/176; 174/50, 50.5, 174/51; 439/108; 257/232, 659, 660, 693, 257/704; 29/505
See application file for complete search history.

(56) References Cited

U.S. PATENT DOCUMENTS

| | | | |
|---|---|---|---|
| 2004/0256643 A1* | 12/2004 | Chuang | H01L 23/36 257/232 |
| 2011/0255850 A1* | 10/2011 | Dinh | G03B 15/03 396/176 |

* cited by examiner

*Primary Examiner* — Courtney Smith
*Assistant Examiner* — Zhengfu Feng
(74) *Attorney, Agent, or Firm* — Merchant & Gould P.C.

(57) ABSTRACT

An apparatus for grounding a chip may be provided. The apparatus may comprise a ground lid, a ground trace, a first substance, and a second substance. The first substance may be configured adhere the ground lid to the ground trace. The second substance may be configured to provide electrical conduction between the ground lid and the ground trace.

25 Claims, 5 Drawing Sheets

GROUND LID OPENING ON A SUBSTRATE

TECHNICAL FIELD

The present disclosure relates generally to chip grounding.

BACKGROUND

Electromagnetic shielding is the practice of reducing the electromagnetic field in a space by blocking the field with barriers made of conductive or magnetic materials. Shielding is typically applied to enclosures to isolate electrical devices from the "outside world", and to cables to isolate wires from the environment through which the cable runs. Electromagnetic shielding that blocks radio frequency (RF) electromagnetic radiation is also known as RF shielding.

The shielding can reduce the coupling of radio waves, electromagnetic fields, and electrostatic fields. A conductive enclosure used to block electrostatic fields is also known as a Faraday cage. The amount of reduction depends upon the material used, its thickness, the size of the shielded volume, the frequency of the fields of interest and the size, shape, and orientation of apertures in a shield to an incident electromagnetic field.

BRIEF DESCRIPTION OF THE DRAWINGS

The accompanying drawings, which are incorporated in and constitute a part of this disclosure, illustrate various embodiments of the present disclosure. In the drawings.

DETAILED DESCRIPTION

Overview

Figure 1:
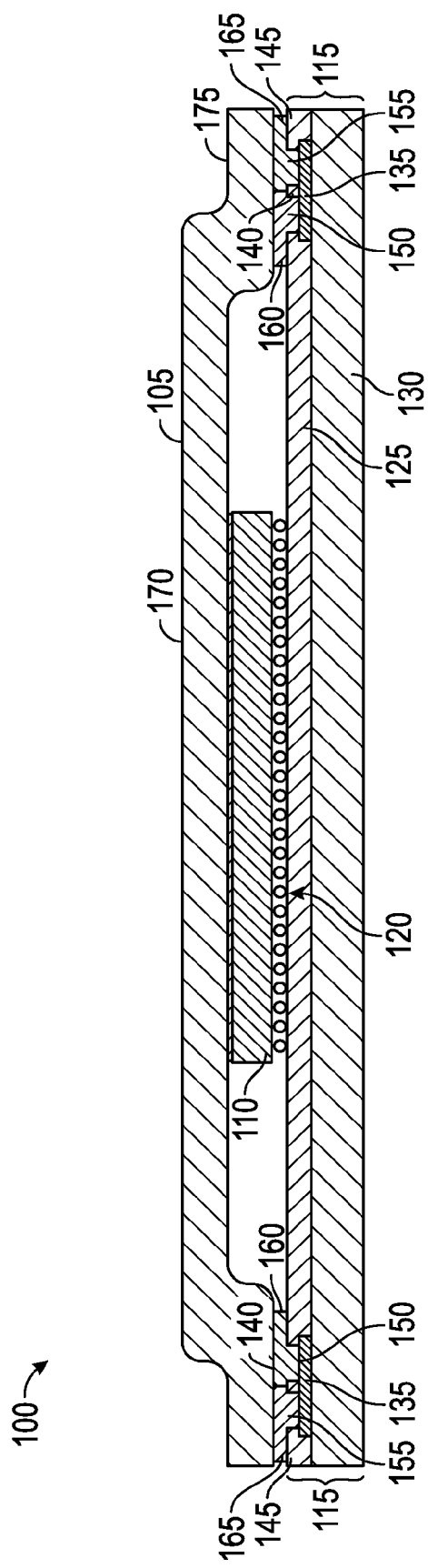
FIG. 1 shows a grounding system.

An apparatus for grounding a chip may be provided. The apparatus may comprise a ground lid, a ground trace that may be connected to a package such as a Ball Grid Array (BGA), a first substance, and a second substance. The first substance may be configured adhere the ground lid to the ground trace. The second substance may be configured to provide electrical conduction between the ground lid and the ground trace.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Flip chip (i.e., a controlled collapse chip connection or C4) is a process for interconnecting semiconductor chips, such as integrated circuit (IC) chips or micro-electromechanical systems (MEMS), to external circuits through solder bumps that have been deposited onto chip pads. The solder bumps are deposited on the chip pads on a top side of a wafer during the final wafer processing step. In order to mount the chip to the external circuit (e.g., a circuit board or another chip or wafer), the chip is flipped over. The chip is flipped with its top side facing down so that the chip pads align with matching pads on the external circuit. The solder bumps are then flowed to complete the interconnection with the external circuit. This is in contrast to wire bonding, in which the chip is mounted upright and wires are used to interconnect the chip pads on the external circuit.

An application-specific integrated circuit (ASIC) is one type of chip mounted using the flip chip process. An ASIC is an integrated circuit (IC) customized for a particular use, rather than intended for general-purpose use. For example, a chip designed to run in a digital voice recorder may comprise an ASIC.

In some situations, a chip may be susceptible to Electromagnetic Interference (EMI). In order to mitigate EMI, a ground lid may be utilized to shield the chip from EMI. In addition to EMI shielding, the ground lid may also serve as a heat sink to aid in removing heat from the chip. In order to provide EMI shielding, the ground lid may be connected to a ground trace on a circuit board on which the chip is mounted. Ground lids for high speed chips (e.g., ASIC chips) installed using the flip chip process may need to meet predetermined grounding specifications in order to EMI shield the high speed chips. For example, the resistance for the ground lid connections may be a low value that may be defined to meet a grounding specification. The resistance may comprise, but is not limited to, 0.2 ohms or less to meet some predetermined grounding specifications.

When connecting a ground lid to a ground trace in conventional flip chip substrate designs, a ground trench in the substrate may be used. Conductive epoxy may be dispensed into the conventional ground trench. The conductive epoxy in conventional systems may include high metal filler particles to provide a good (e.g., low) conductive resistance. However, due to the low volume of adhesive in the conventional conductive epoxy, ground lid adhesion strength is lowered considerably. Consequently, while the resistance for the ground lid connection may be met, the ground lid may "pop off" and no longer be connected to the ground trace because of the low adhesion strength of the conductive epoxy. This problem may be exaggerated by the lid also serving as a heat sink. In other words, the adhesion may be lowered more due to the heat of the ground lid. Once the ground lid pops off, it may no longer provide adequate EMI shielding for the chip.

Consistent with embodiments of the disclosure, a two trench system may be used. One trench may be filled with a low resistance, highly conductive epoxy to provide a grounding resistance low enough to meet the predetermined grounding specifications in order to provide adequate EMI shielding. The other trench may be filled with non-conductive, high adhesion epoxy in order to hold the ground lid in place even when the ground lid heats up due to sinking heat from the chip.

FIG. 1 shows a grounding system 100. As shown in FIG. 1, grounding system 100 may comprise a ground lid 105, a chip 110, and a substrate 115 on which chip 110 may be mounted through a plurality of solder bumps 120 using the aforementioned flip chip process. Substrate 115 may comprise a resist 125, a circuit board 130, and a ground trace 135. A barrier 140 and an edge 145 may be formed when a first trench 150 and a second trench 155 are formed in resist 125. First trench 150 may comprise a first substance 160 and second trench 155 a second substance 165. Ground lid 105 may comprise an upper section 170 and a foot section 175. First substance 160 and second substance 165 may contact foot section 175.

Figure 2:
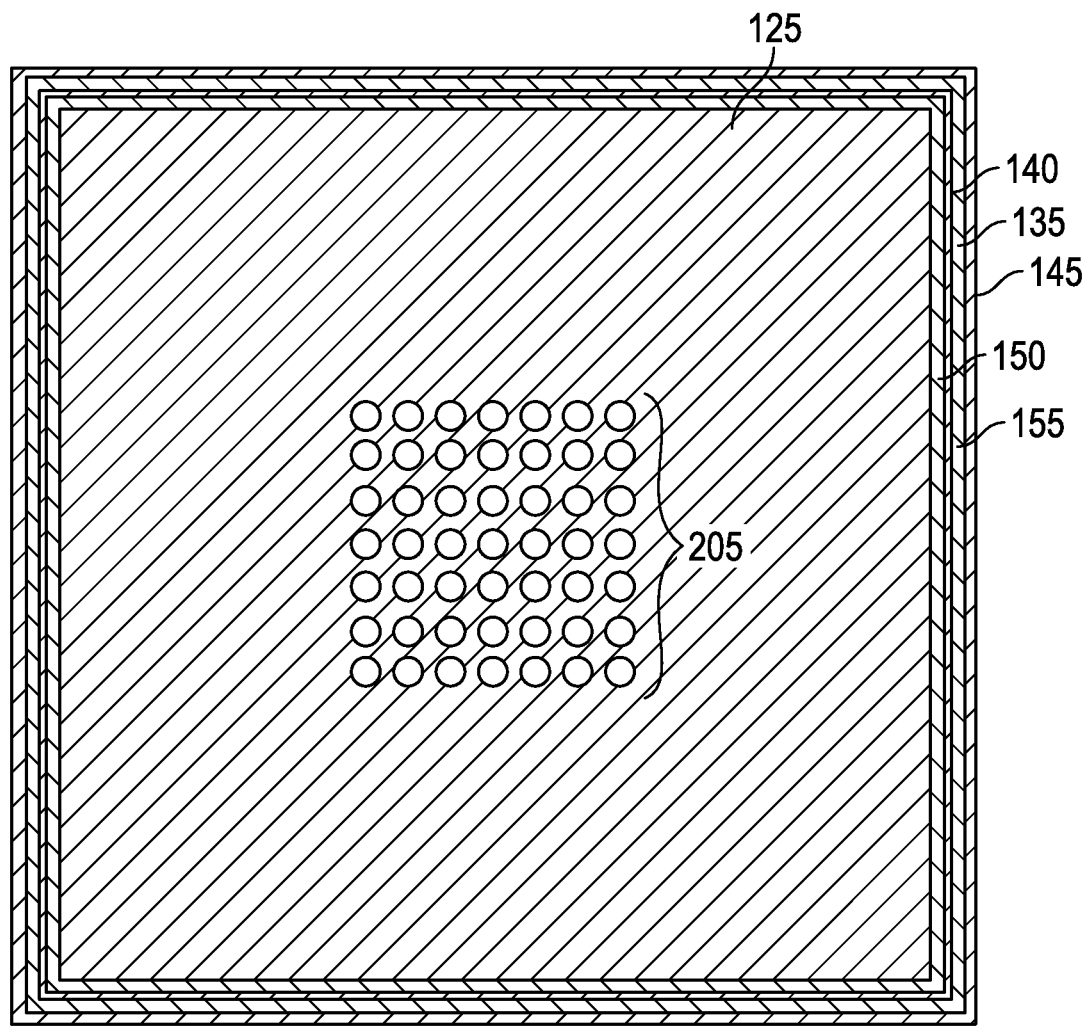
FIG. 2 shows a top view of a substrate.

FIG. 2 shows a top view of substrate 115. Consistent with embodiments of the disclosure, first trench 150 and second trench 155 may be formed in resist 125 exposing ground trace 135. Furthermore, barrier 140 and edge 145 may be formed when first trench 150 and second trench 155 are formed in resist 125.

As shown in FIG. 2, substrate 115 may include a plurality of circuit pad 205. The flip chip process may be used to interconnect chip 110 to substrate 115 through plurality of solder bumps 120 that may have been deposited onto plurality of circuit pad 205. Plurality of solder bumps 120 may be deposited on plurality of circuit pad 205 on a top side of a wafer during the final wafer processing step. In order to mount chip 110 to substrate 115, chip 110 may be flipped over. Chip 110 may be flipped with its top side facing down so that chip 110's pads align with matching plurality of circuit pad 205. Plurality of solder bumps 120 may then be flowed to complete the interconnection with substrate 115.

Consistent with embodiments of the disclosure, first substance 160 may be placed in first trench 150 and second substance 165 may be placed in second trench 155. Ground lid 105 may then be placed over chip 110. Ground lid 105 (e.g., foot section 175) may be in contact with first substance 160 and second substance 165. Ground lid 105 may be in contact with chip 110 in order to provide heat sinking for chip 110 for example.

Figure 3:
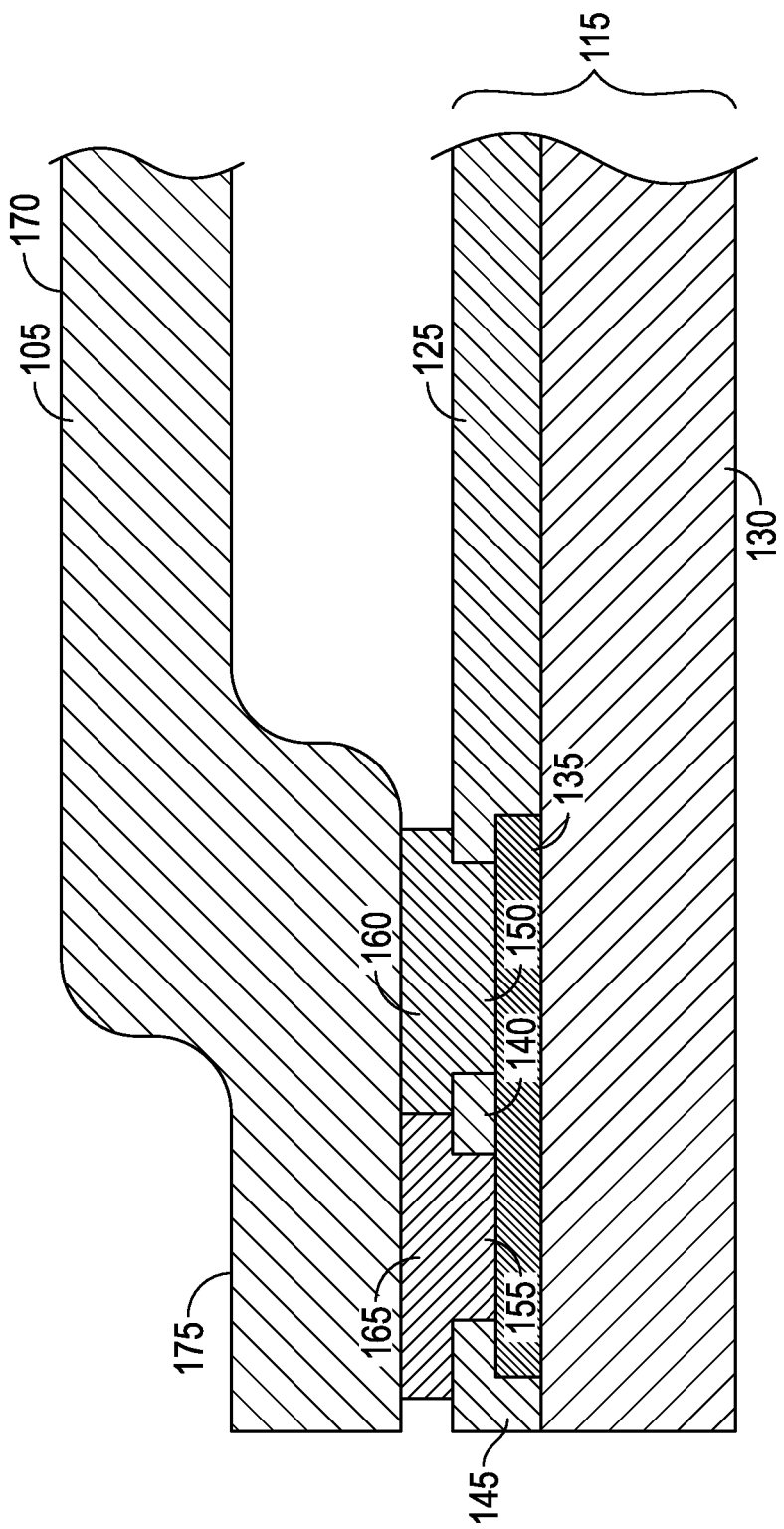
FIG. 3 shows a grounding system.

FIG. 3 shows grounding system 100 in more detail. In order to mitigate EMI, ground lid 105 may be utilized to shield chip 110 from EMI. Ground lid 105 may also serve as a heat sink to aid in removing heat from chip 110. In order to provide EMI shielding, ground lid 105 may be connected to ground trace 135 on substrate 115 on which chip 110 may be mounted. Because chip 110 may be a high speed chip, ground lid 105 may need to meet predetermined grounding specifications in order to EMI shield chip 110. For example, the resistance for ground lid 105's connection with ground trace 135 may be 0.2 ohms or less in order to meet some predetermined grounding specifications. Moreover, ground lid 105 may need to stay on and not pop off even when ground lid 105 is serving as a heat sink in order to provide adequate EMI shielding for chip 110.

Consistent with embodiments of the disclosure, in order to provide low resistance and high adhesion, a multiple (e.g., two) trench system (e.g., first trench 150 and second trench 155) may be used. One of first trench 150 or second trench 155 may be filled with a low resistance, highly conductive epoxy to provide a grounding resistance low enough to meet the predetermined grounding specifications in order to provide adequate EMI shielding. The other of first trench 150 or second trench 155 may be filled with non-conductive, high adhesion epoxy in order to hold ground lid 105 in place even when ground lid 105 heats up due to sinking heat from chip 110.

As shown in FIG. 3, barrier 140 may be configured to separate first substance 160 and second substance 165. In addition, barrier 140 may be configured to keep first substance 160 and second substance 165 from mixing on ground trace 135. For example, if the low resistance, highly conductive epoxy were to mix or layer with the non-conductive, high adhesion epoxy, embodiments of the disclosure may not provide the aforementioned desired low resistance and high adhesion.

Figure 4:
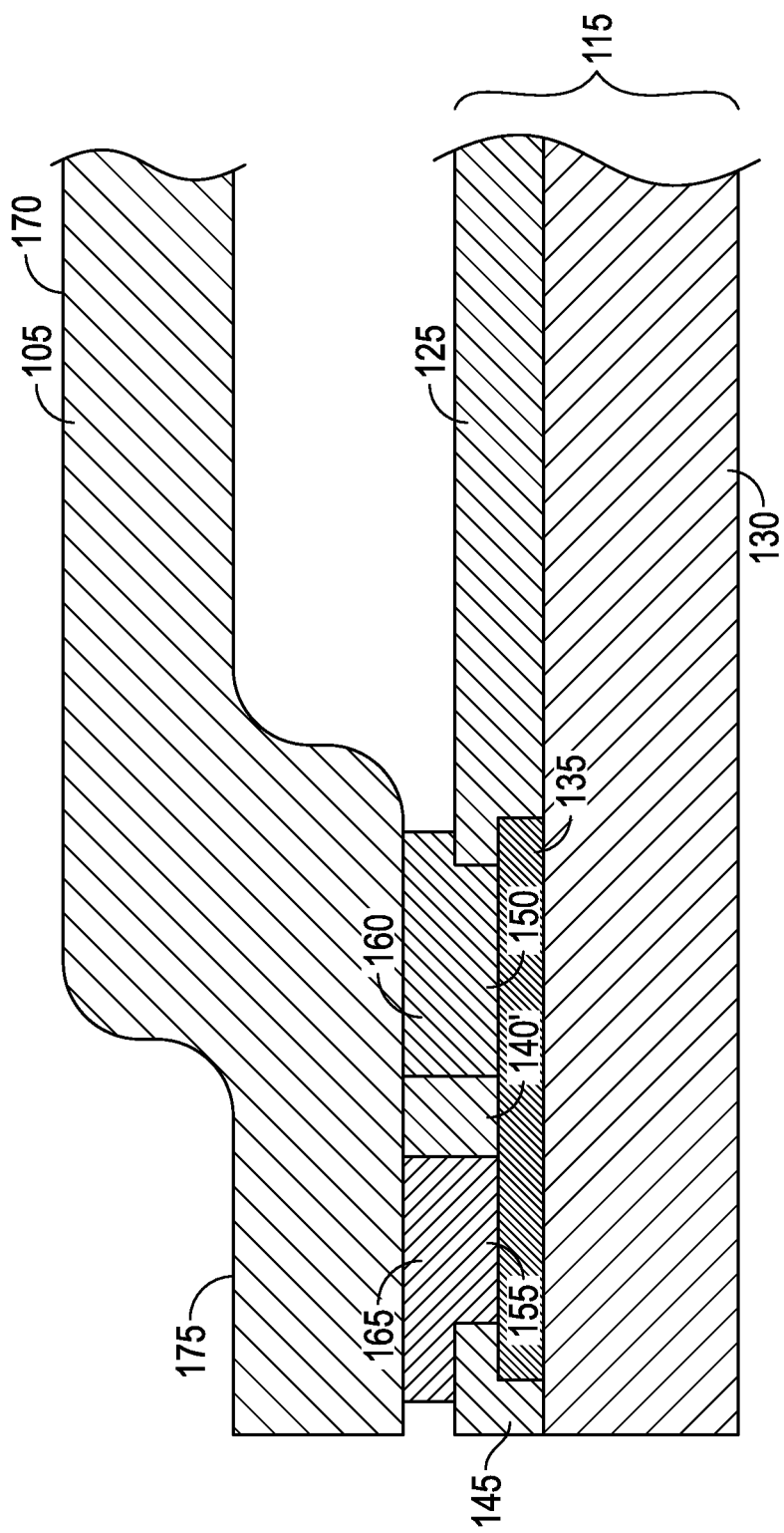
FIG. 4 shows a grounding system.

FIG. 4 shows grounding system 100 in more detail. As shown in FIG. 4, a barrier 140' may touch ground lid 105 (e.g., foot section 175) and separates first substance 160 from second substance 165. This may be desired if first substance 160 and second substance 165 are chemically incompatible. In other words, if first substance 160 and second substance 165 have the potential of having an undesired chemical or physical reaction, barrier 140' may serve to separates first substance 160 from second substance 165 and mitigate any undesired chemical or physical reaction.

Figure 5:
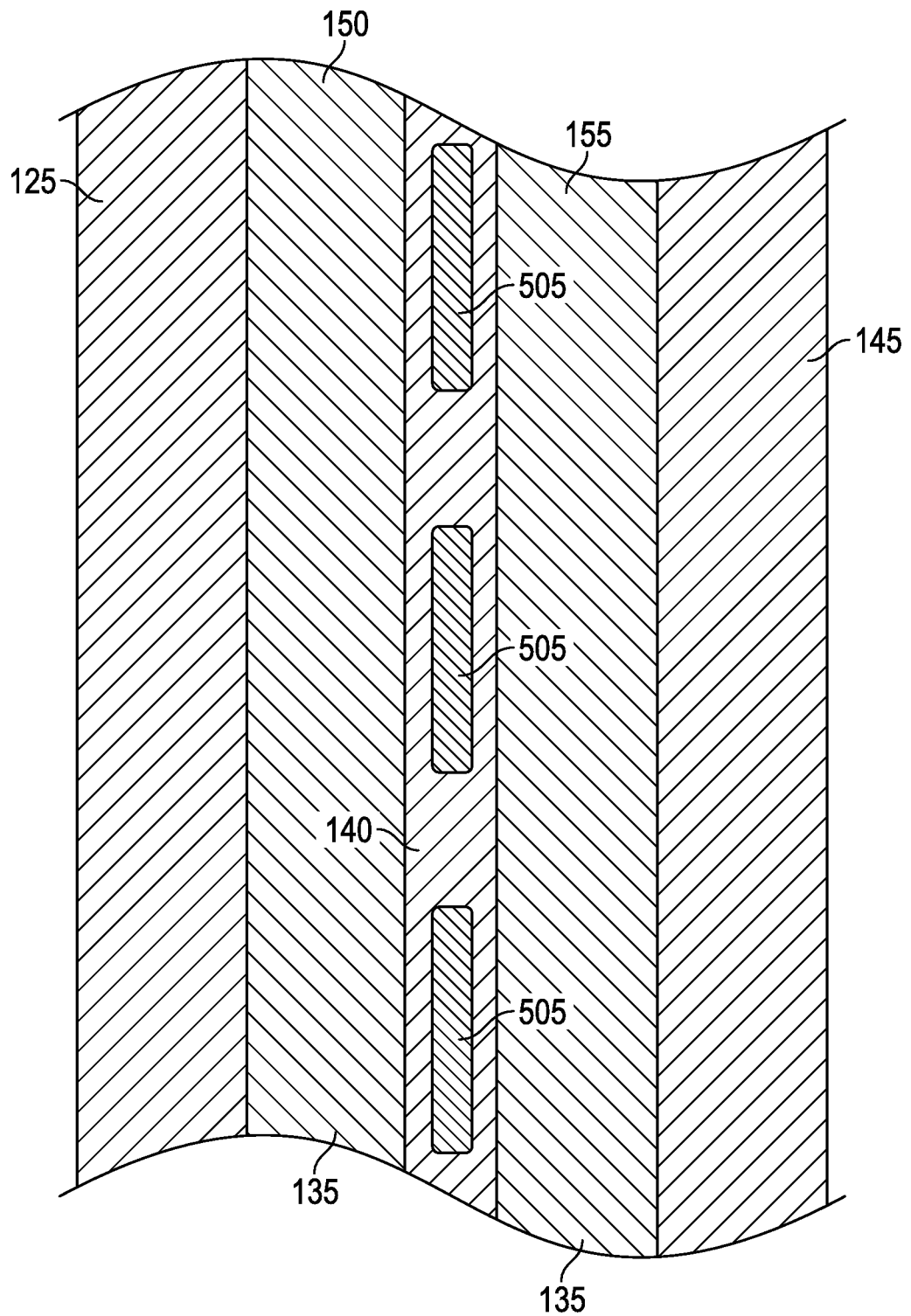
FIG. 5 shows a barrier with anchors.

FIG. 5 shows barrier 140 (or barrier 140') with plurality of anchors 505. As shown in FIG. 5, ground trace 135 may further comprises at least one of plurality of anchors 505 that may be configured to hold barrier 140 (or barrier 140') in place. When barrier 140 (or barrier 140') is formed when first trench 150 and second trench 155 are formed in resist 125, barrier 140 (or barrier 140') may tend to slide, become serpentine, or even separate form ground trace 135. In order to mitigate this issue, plurality of anchors 505 may be formed in ground trace 135 in order to cause barrier 140 (or barrier 140') to cleave to ground trace 135.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus comprising:
    a ground lid;
    a ground trace wherein the ground trace further comprises at least one anchor that holds a barrier in place;
    a first substance adhering the ground lid to the ground trace; and
    a second substance providing electrical conduction between the ground lid and the ground trace.

2. The apparatus of claim 1, wherein the ground lid comprises:
    an upper section; and
    a foot section.

3. The apparatus of claim 2, wherein the first substance and the second substance are in contact with the foot section.

4. The apparatus of claim 1, wherein the ground trace is disposed within a substrate.

5. The apparatus of claim 4, wherein the substrate comprises a first trench containing the first substance.

6. The apparatus of claim 4, wherein the substrate comprises a second trench containing the second substance.

7. The apparatus of claim 1, wherein the first substance maintains adherence between the ground lid and the ground trace when the ground lid dissipates heat from a chip in contact with the ground lid.

8. The apparatus of claim 1, wherein the second substance provides electrical conduction between the ground lid and the ground trace sufficient to provide Electromagnetic Interference (EMI) shielding to a chip disposed under the ground lid.

9. The apparatus of claim 1, wherein the barrier is in contact with the ground lid.

10. The apparatus of claim 1, wherein the barrier separates the first substance and the second substance.

11. The apparatus of claim 1, wherein the barrier keeps the first substance and the second substance from mixing on the ground trace.

12. The apparatus of claim 1, wherein the barrier is disposed between a first trench containing the first substance and a second trench containing the second substance.

13. The apparatus of claim 1, further comprising a chip disposed between the ground lid and a substrate comprising the ground trace.

14. The apparatus of claim 13, wherein the chip comprises a flip chip semiconductor device.

15. The apparatus of claim 13, wherein the chip comprises an Application-Specific Integrated Circuit (ASIC).

16. The apparatus of claim 13, wherein the ground lid dissipates heat from the chip.

17. The apparatus of claim 13, wherein the ground lid provides Electromagnetic Interference (EMI) shielding to the chip.

18. A method comprising:
   providing a first trench in a resist disposed on a circuit board;
   providing a second trench in the resist wherein a barrier is created between the first trench and the second trench;
   placing a first substance in the first trench;
   placing a second substance in the second trench, the second substance being in contact with a ground trace disposed on the circuit board, the ground trace further comprising at least one anchor that holds the barrier in place;
   providing a chip on the circuit board; and
   placing a ground lid over the chip, the ground lid being in contact with the first substance and the second substance.

19. The method of claim 18, wherein providing the second trench in the resist comprises providing the second trench in the resist wherein the barrier separates the first substance and the second substance.

20. The method of claim 18, wherein providing the second trench in the resist comprises providing the second trench in the resist wherein the barrier keeps the first substance and the second substance from mixing on the ground trace.

21. The method of claim 18, wherein placing the first substance in the first trench comprises placing the first substance in the first trench wherein the first substance maintains adherence between the ground lid and the ground trace when the ground lid dissipates heat from the chip in contact with the ground lid.

22. The method of claim 18, wherein placing the second substance in the second trench comprises placing the second substance in the second trench wherein the second substance provides electrical conduction between the ground lid and the ground trace sufficient to provide Electromagnetic Interference (EMI) shielding to the chip.

23. An apparatus comprising:
   a first substance adhering a foot of a ground lid to a ground trace;
   a second substance providing electrical conduction between the foot of the ground lid and a ground trace; and
   a barrier separating the first substance and the second substance, wherein the barrier keeps the first substance and the second substance from mixing on the ground trace, wherein the ground trace further comprises at least one anchor that holds the barrier in place.

24. The apparatus of claim 23, wherein the first substance maintains adherence between the ground lid and the ground trace when the ground lid dissipates heat from a chip in contact with the ground lid.

25. The apparatus of claim 23, wherein the second substance provides electrical conduction between the ground lid and the ground trace sufficient to provide Electromagnetic Interference (EMI) shielding to a chip disposed under the ground lid.

* * * * *